(12) United States Patent
Itai

(10) Patent No.: US 7,323,704 B2
(45) Date of Patent: Jan. 29, 2008

(54) CHIP TYPE LED

(75) Inventor: Junichi Itai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/572,861

(22) PCT Filed: Jun. 7, 2004

(86) PCT No.: PCT/JP2004/007932

§ 371 (c)(1),
(2), (4) Date: Mar. 22, 2006

(87) PCT Pub. No.: WO2005/029600

PCT Pub. Date: Mar. 31, 2005

(65) Prior Publication Data

US 2007/0040253 A1 Feb. 22, 2007

(30) Foreign Application Priority Data

Sep. 24, 2003 (JP) ............................. 2003-331980

(51) Int. Cl.
*H01L 23/02* (2006.01)
(52) U.S. Cl. ...................................... 250/552; 257/678
(58) Field of Classification Search ................. 257/81, 257/99, 100, 623, 653, 678
See application file for complete search history.

(56) References Cited

U.S. PATENT DOCUMENTS

| 4,935,665 | A | | 6/1990 | Murata | |
|---|---|---|---|---|---|
| 5,705,834 | A | * | 1/1998 | Egalon et al. | 257/95 |
| 5,955,748 | A | * | 9/1999 | Nakamura et al. | 257/88 |
| 6,392,294 | B1 | | 5/2002 | Yamaguchi | |
| 6,429,462 | B1 | * | 8/2002 | Shveykin | 257/95 |
| 7,195,942 | B2 | * | 3/2007 | Eisert et al. | 438/33 |
| 2007/0040253 | A1 | * | 2/2007 | Itai | 257/678 |

FOREIGN PATENT DOCUMENTS

| JP | 60-50978 | 3/1985 |
|---|---|---|
| JP | 1-309201 | 12/1989 |
| JP | 5-327012 | 12/1993 |
| JP | 10-50734 | 2/1998 |
| JP | 11-354837 | 12/1999 |
| JP | 2000-188358 | 7/2000 |

* cited by examiner

*Primary Examiner*—John R. Lee
(74) *Attorney, Agent, or Firm*—Hamre, Schumann, Mueller & Larson, P.C.

(57) ABSTRACT

A chip type LED which is capable of laterally emitting light from the light emitting diode chip and having a relatively small thickness is provided. The chip type LED includes an insulating substrate 12, a light emitting diode chip 15 mounted on the upper surface of the insulating substrate, and a transparent package 16 provided on the upper surface of the insulating substrate to hermetically seal the light emitting diode chip. The light emitting diode chip 15 is mounted on the upper surface of the insulating substrate with the anode electrode 15*f* of the light emitting diode chip oriented downward and the cathode electrode 15*a* oriented upward.

4 Claims, 3 Drawing Sheets

PRIOR ART

CHIP TYPE LED

TECHNICAL FIELD

The present invention relates to a chip type LED comprising a light emitting diode chip as a light source and a transparent package hermetically sealing the light emitting diode chip.

BACKGROUND ART

FIG. 4 is a perspective view showing a prior art chip type LED. The chip type LED 1 includes an insulating substrate 2 in the form of a chip, a pair of terminal electrodes 3 and 4 formed on an upper surface of the insulating substrate, and a light emitting diode chip 5 mounted on the terminal electrode 3 with the anode electrode 5b oriented upward and the cathode electrode 5a oriented downward for electrical connection to the terminal electrode 3. The anode electrode 5b is electrically connected to the terminal electrode 4 by e.g. wire bonding using a non-illustrated thin metal wire. A transparent package 6 for hermetically sealing the light emitting diode chip 5 is provided on the upper surface of the insulating substrate 2 (See Patent Document 1).

Conventionally, when a plurality of chip type LEDs having the above-described structure is used as a backlight source for key switches arranged in matrix in a cell phone A, the chip type LEDs 1 are arranged on a circuit board C below the key switches B at positions between the key switches B, as shown in FIG. 5. With this arrangement, the key switches B are illuminated with the light emitted laterally from the side surfaces of the packages 6 of the chip type LEDs 1.

Patent Document 1: JP-A-H10-50734

DISCLOSURE OF THE INVENTION

Problems to be Solved by the Invention

In the above-described chip type LED 1, most of the light generated from the light emitting diode chip 5 is emitted laterally through the side surfaces of the light emitting diode chip 5. However, part of the light is emitted upward through the anode electrode 5b on the upper surface. Therefore, the amount of light emitted through the side surfaces of the light emitting diode chip 5 is reduced by as much as the amount of light emitted upward through the anode electrode 5b on the upper surface.

In other words, the illumination for the key switches B becomes weak by as much as the amount of light from the light emitting diode chip 5 which is emitted upward through the anode electrode 5b on the upper surface.

Recently, therefore, in using the chip type LED 1 as a backlight source, a recess is formed at the upper surface of the package body 6 so that the light emitted upward through the anode electrode 5b on the upper surface of the light emitting diode chip 5 is refracted on the recess to travel laterally.

However, to provide such a structure, thickness enough for forming a recess need be ensured between the upper surface of the package 6 and the upper surface of the light emitting diode chip 5. Therefore, the thickness for providing the recess is added to the height H0' of the package 6, which results in an increase in the height H' of the entire chip type LED 1. Therefore, the chip type LED for use as a backlight source cannot be reduced in thickness.

It is, therefore, an object of the present invention to solve the above-described problems and to provide a thin chip type LED usable as a backlight source.

Means for Solving the Problems

To achieve the above object, a chip type LED according to the present invention comprises an insulating substrate, a light emitting diode chip mounted on an upper surface of the insulating substrate, and a transparent package provided on the upper surface of the insulating substrate to hermetically seal the light emitting diode chip. The light emitting diode chip, including an anode electrode and a cathode electrode, is mounted on the upper surface of the insulating substrate with the anode electrode of the chip oriented downward and the cathode electrode of the chip oriented upward.

Preferably, the light emitting diode chip further includes a light emitting layer arranged adjacent to the cathode electrode, while also including a side surface inclined inwardly as the side surface extends from the cathode electrode toward the anode electrode.

Preferably, the upper surface of the insulating substrate is made while at least around the light emitting diode chip.

Advantages of the Invention

The light emitting diode chip includes an opaque substrate on the cathode electrode side.

Therefore, by mounting the light emitting diode chip on the upper surface of an insulating substrate so that the anode electrode of the light emitting diode chip is oriented downward whereas the cathode electrode is oriented upward, the substrate of the light emitting diode chip prevents the light generated at the light emitting layer of the light emitting diode chip from being emitted upward from the cathode electrode side.

In this way, according to the present invention, the upward light emission through the upper surface of the light emitting diode chip is prevented, so that the lateral light emission through the side surface of the light emitting diode chip is increased. Therefore, unlike the prior art structure, the provision of a recess at the upper surface of the package for the light emitting diode chip can be eliminated. Therefore, the height of the package, and hence the height of the entire chip type LED can be reduced so that the LED can be advantageously used as a backlight source for a key switch of a cell phone, for example.

In a preferable structure of the invention, while keeping the area of the light emitting layer in the light emitting diode chip relatively large, the light generated at the light emitting layer can be emitted through the inwardly inclined side surface without significant attenuation. Therefore, the amount of light emitted laterally is considerably increased.

Further, in another preferable structure of the invention, the light emitted from the light emitting diode chip toward the insulating substrate is reflected by the white color, whereby the amount of light which travels laterally is further increased.

DESCRIPTION OF SIGNS

Figure 1:
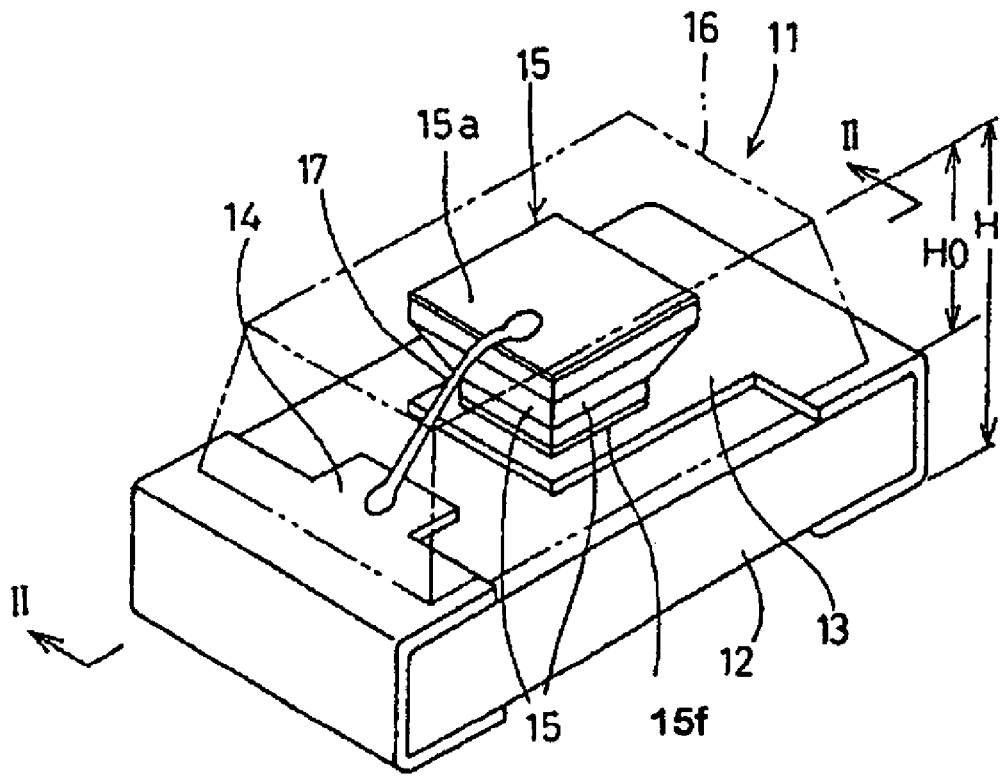
FIG. 1 is a perspective view showing a chip type LED according to an embodiment of the present invention.

11: chip type LED
12: insulating substrate
13, 14: terminal electrode
15: light emitting diode chip
15a: cathode electrode of light emitting diode chip
15b: substrate of light emitting diode chip
15c: n-type semiconductor layer of light emitting diode chip
15d: light emitting layer of light emitting diode chip
15e: p-type semiconductor layer of light emitting diode chip
15f: anode electrode of light emitting diode chip
16: package
17: metal wire
18: white color film

BEST MODE FOR CARRYING OUT THE INVENTION

Figure 2:
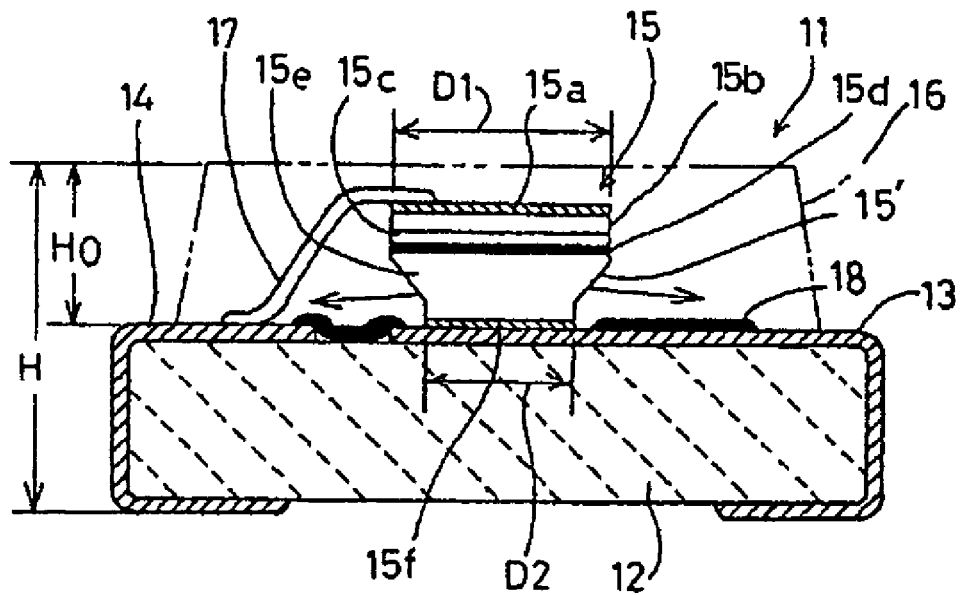
FIG. 2 is a sectional view taken along lines II-II in FIG. 1.

A preferred embodiment of the present invention will be described below with reference to FIGS. 1 and 2.

Indicated by reference sign 11 in the figures is a chip type LED according to an embodiment of the present invention.

The chip type LED 11 comprises an insulating substrate 12 which is in the form of a chip having an upper surface formed with a pair of terminal electrodes 13 and 14, a light emitting diode chip 15 mounted on the upper surface of the insulating substrate 12, and a transparent package 16 provided on the upper surface of the insulating substrate 12 to hermetically seal the light emitting diode chip 15.

The light emitting diode chip 15 comprises a substrate 15b made of e.g. silicon and having a surface on which a cathode electrode 15a is provided and another surface on which an n-type semiconductor layer 15c, a light emitting layer 15d, a p-type semiconductor layer 15e and an anode electrode 15f are provided one upon another.

The light emitting diode chip 15 is so designed that the n-type semiconductor layer 15c has a relatively small thickness whereas the p-type semiconductor layer 15e has a relatively large thickness, so that the light emitting layer 15d is positioned relatively close to the cathode electrode 15a.

Further, the light emitting diode chip 15 is so designed that the dimension D1 at the cathode electrode 15a on one surface side of the chip is larger than the dimension D2 at the anode electrode 15f on the other surface side of the chip. Therefore, the side surface 15' of the light emitting diode chip 15 is inclined inwardly as it extends from the cathode electrode 15a side toward the anode electrode 15f side.

The light emitting diode chip 15 is mounted on the insulating substrate 12 with the cathode electrode 15a of the light emitting diode chip 15 oriented upward and the anode electrode 15f oriented downward so that the anode electrode 15f is electrically connected to the terminal electrode 13 by die bonding. The cathode electrode 15a on the upper surface of the light emitting diode chip 15 is electrically connected to the terminal electrode 14 by wire bonding using a thin metal wire 17, for example.

With this arrangement, when light is generated at the light emitting layer 15d due to the energization of the light emitting diode chip 15, the substrate 15b prevents the light from being emitted upward through the upper surface of the light emitting diode chip 15. Therefore, almost all of the generated light is emitted laterally through the side surface.

Therefore, unlike the prior art structure, the provision of a recess at the upper surface of the package 16 hermetically sealing the light emitting diode chip 15 can be eliminated. Accordingly, the thickness between the upper surface of the package 16 and the upper surface of the light emitting diode chip 15 can be reduced. As a result, the height H0 of the package 16, and hence, the height H of the entire chip type LED 11 can be reduced. In other words, the thickness of the chip type LED 11 can be reduced.

Figure 3:
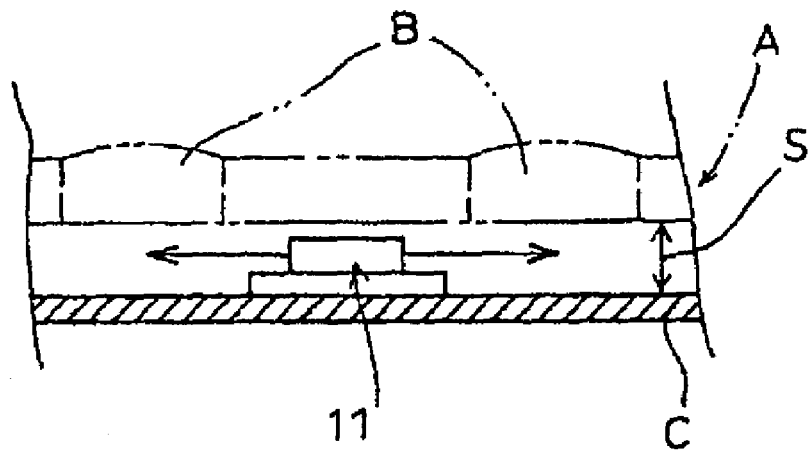
FIG. 3 is a sectional view showing the chip type LED used as a backlight source for a key switch.
Figure 4:
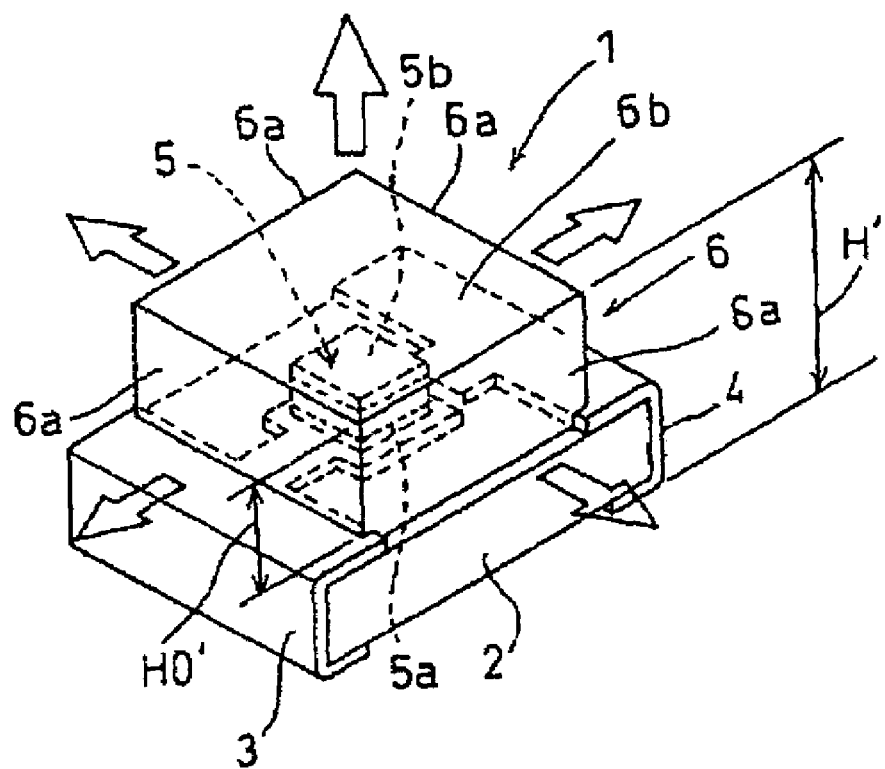
FIG. 4 is a perspective view showing a prior art chip type LED.
Figure 5:
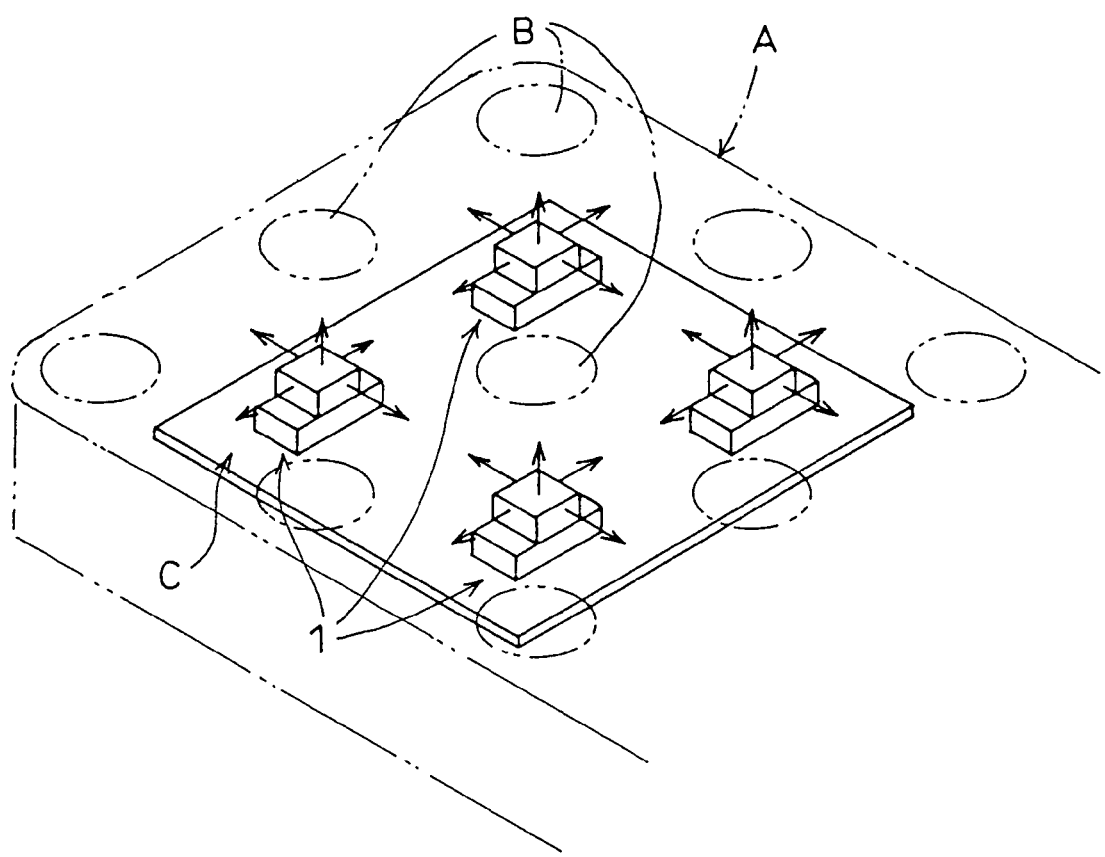
FIG. 5 is a perspective view showing an example of application of the prior art chip type LED.

In this way, the chip type LED 11 according to the present invention can laterally emit light and have a small thickness. Therefore, when the chip type LED is used as a backlight source for key switches B of a cell phone A by mounting the LED on a circuit board C below the key switches B at a position between the key switches B similarly to the instance shown in FIG. 5, the spacing S between each of the key switches B and the circuit board C can be reduced, as shown in FIG. 3. Therefore, the cell phone can be reduced correspondingly in size and weight.

Further, while the light emitting layer 15d of the light emitting diode chip 15 is positioned relatively close to the cathode electrode 15a defining the upper surface of the light emitting diode chip 15, the side surface 15' of the light emitting diode chip 15 is inclined inwardly as it extends from the cathode electrode 15a toward the anode electrode 15f. With this arrangement, while keeping the area of the light emitting layer 15d relatively large, the light generated at the light emitting layer 15d can be emitted out of the inwardly inclined side surface 15' without significant attenuation. Therefore, the amount of light emitted laterally can be increased.

Part of the light emitted laterally from the side surface 15' of the light emitting diode chip 15 reaches the upper surface of the insulating substrate 12. Therefore, the upper surface of the insulating substrate is provided with a white color film 18 at the portion which is reached by the light from the light emitting diode chip 15, i.e. the portion around the light emitting diode chip.

With this arrangement, the light reaching the upper surface of the insulating substrate 12 is reflected by the white color film 18 to travel laterally, whereby the amount of light which travels laterally is further increased.

Instead of providing the white color film 18, the upper surface of the insulating substrate 12 may be made white.

The invention claimed is:

1. A chip LED comprising an insulating substrate, a light emitting diode chip mounted on an upper surface of the insulating substrate, and a transparent package provided on the upper surface of the insulating substrate to seal the light emitting diode chip, wherein the light emitting diode chip is mounted on the upper surface of the insulating substrate with an anode electrode of the chip located closer to the insulating substrate than a cathode electrode of the chip so that the anode is located between the cathode and the insulating substrate; and wherein the light emitting diode chip includes a diode substrate and a light emitting layer between the anode and the cathode, the light emitting layer being located closer to the cathode than to the anode, the diode substrate being located between the cathode and the light emitting layer for preventing light generated at the light emitting layer from being emitted through the cathode.

2. The chip LED according to claim 1, wherein the light emitting diode chip includes a side surface inclined inwardly as the side surface extends from the cathode electrode toward the anode electrode.

3. The chip LED according to claim 1, wherein the upper surface of the insulating substrate is formed with a white color film at least around the light emitting diode chip.

4. The chip LED according to claim 1, wherein the light emitting chip further includes a n-type semiconductor layer located between the diode substrate and the light emitting layer, and a p-type semiconductor layer located between the anode and the light emitting layer, the p-type semiconductor layer having a greater thickness than the n-type semiconductor layer.

* * * * *